(12) United States Patent
Zhu et al.

(10) Patent No.: US 11,203,808 B2
(45) Date of Patent: Dec. 21, 2021

(54) MASK PLATE

(71) Applicant: BOE Technology Group Co., Ltd., Beijing (CN)

(72) Inventors: Haibin Zhu, Beijing (CN); Weijie Wang, Beijing (CN); Fengjie Zhang, Beijing (CN); Bo Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/629,580

(22) PCT Filed: Nov. 14, 2018

(86) PCT No.: PCT/CN2018/115435
§ 371 (c)(1),
(2) Date: Jan. 9, 2020

(87) PCT Pub. No.: WO2019/134446
PCT Pub. Date: Jul. 11, 2019

(65) Prior Publication Data
US 2020/0190655 A1   Jun. 18, 2020

(30) Foreign Application Priority Data

Jan. 2, 2018   (CN) .......................... 201810002735.6

(51) Int. Cl.
*C23C 14/04* (2006.01)
*C23C 14/24* (2006.01)
(Continued)

(52) U.S. Cl.
CPC .......... *C23C 14/042* (2013.01); *B05C 21/005* (2013.01); *C23C 14/24* (2013.01); *H01L 51/56* (2013.01); *H01L 51/0011* (2013.01)

(58) Field of Classification Search
None
See application file for complete search history.

(56) References Cited

U.S. PATENT DOCUMENTS

| | | |
|---|---|---|
| 5,898,259 A | 4/1999 | Reyal |
| 2006/0011137 A1 | 1/2006 | Keller |
| (Continued) | | |

FOREIGN PATENT DOCUMENTS

| | | |
|---|---|---|
| CN | 103911584 A | 7/2014 |
| CN | 204529949 U | 8/2015 |
| (Continued) | | |

OTHER PUBLICATIONS

First office action of Chinese application No. 201810002735.6 dated Feb. 28, 2019.
(Continued)

*Primary Examiner* — Jethro M. Pence
(74) *Attorney, Agent, or Firm* — Fay Sharpe LLP

(57) ABSTRACT

A mask plate includes a plurality of first supporting and shielding strips, and a plurality of second supporting and shielding strips. The second supporting and shielding strips and the first supporting and shielding strips perpendicularly intersect. The first supporting and shielding strips and the second supporting and shielding strips are provided with at least one objective supporting and shielding strip, and an edge of a predetermined surface of the objective supporting and shielding strip parallel to an extending direction of the objective supporting and shielding strip is provided with a thinned area; the thinned area extends in the extending direction of the objective supporting and shielding strip, and has a thickness smaller than a thickness of other areas except the thinned area; and the predetermined surface is a surface of the objective supporting and shielding strip facing a deposition material when a mask evaporation is performed through the mask plate.

17 Claims, 7 Drawing Sheets

(51) Int. Cl.
  *H01L 51/56* (2006.01)
  *B05C 21/00* (2006.01)
  *H01L 51/00* (2006.01)

(56) References Cited

U.S. PATENT DOCUMENTS

| | | | |
|---|---|---|---|
| 2011/0174217 A1* | 7/2011 | Gersdorff | ............ C23C 16/042 |
| | | | 118/500 |
| 2017/0141313 A1 | 5/2017 | Min | |
| 2018/0080114 A1 | 3/2018 | Chang | |
| 2018/0155818 A1* | 6/2018 | Mu | ................. C23C 14/12 |
| 2018/0202034 A1 | 7/2018 | Lin et al. | |
| 2018/0239241 A1* | 8/2018 | Lv | ..................... G03F 1/50 |
| 2018/0312957 A1 | 11/2018 | Zhang | |
| 2019/0062895 A1 | 2/2019 | Zhang et al. | |

FOREIGN PATENT DOCUMENTS

| | | |
|---|---|---|
| CN | 105002464 A | 10/2015 |
| CN | 105839052 A | 8/2016 |
| CN | 106019819 A | 10/2016 |
| CN | 205662587 U | 10/2016 |
| CN | 106884140 A | 6/2017 |
| CN | 107523788 A | 12/2017 |
| CN | 206692716 U | 12/2017 |
| EP | 3473744 A1 | 4/2019 |
| JP | 2012077328 A | 4/2012 |
| KR | 20070037510 A | 4/2007 |
| KR | 20140054222 A | 5/2014 |
| KR | 20140054223 A | 5/2014 |
| KR | 101659948 B1 | 10/2016 |
| WO | 2013026492 A1 | 2/2013 |
| WO | 2013026493 A1 | 2/2013 |
| WO | 2017156873 A1 | 9/2017 |

OTHER PUBLICATIONS

Examination report of Indian application No. 202027002652 dated Jul. 3, 2021.
Extended European search report of counterpart EP application No. 18897920.7 dated Sep. 24, 2021.
Notice of allowance of Korean application No. 10-2020-7003898 dated Sep. 13, 2021.
Umashankar Balunaini et al, Interaction of Ribbed-Metal-Strip Reinforcement with Tire Shred-Sand Mixtures Geotechnical and Geological Engineering, Kluwer Academic Publishers, DO, vol. 28, No. 2, Dec. 15, 2009, pp. 147-163, entire document.

* cited by examiner

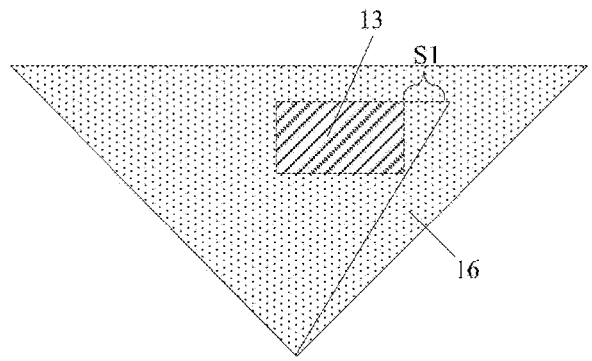
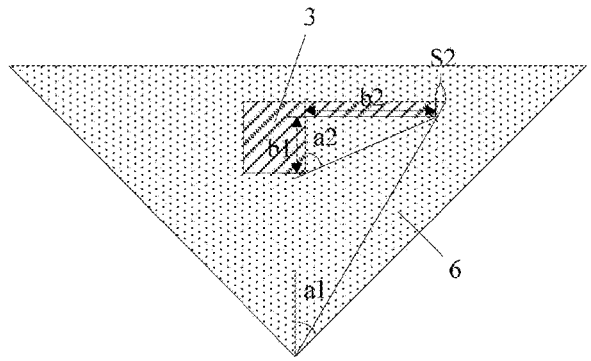
FIG. 5  FIG. 6
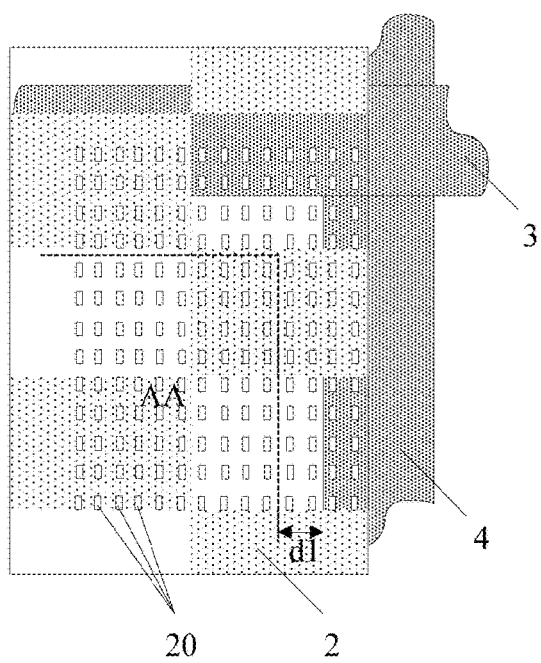
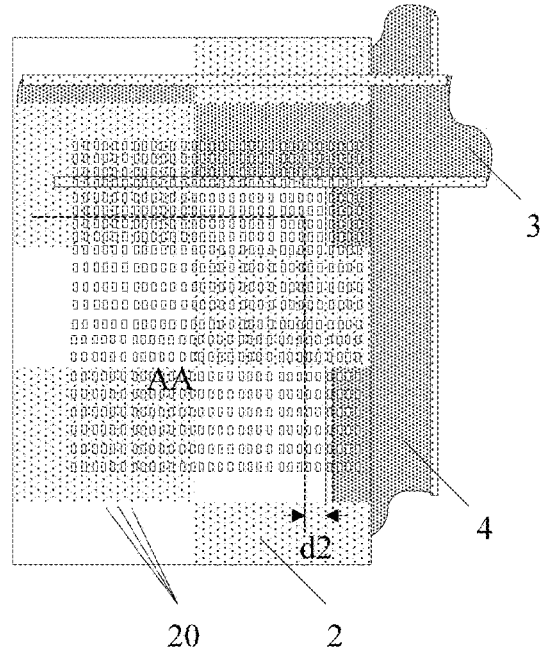
FIG. 7  FIG. 8
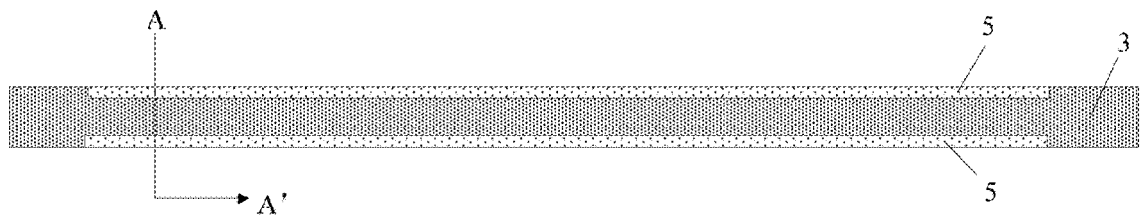
FIG. 9

MASK PLATE

CROSS-REFERENCE TO RELATED APPLICATION

This application is a 371 of PCT Application No. PCT/CN2018/115435 filed on Nov. 14, 2018, which claims priority to Chinese Patent Application No. 201810002735.6, filed on Jan. 2, 2018 to the CNIPA and entitled "Mask Plate", the entire contents of which are incorporated herein by reference.

TECHNICAL FIELD

The embodiments of the present disclosure relate to a mask plate.

BACKGROUND

Flat panel displays (FPDs) have already become mainstream products on the market, and more and more types of the FPDs appear, such as liquid crystal displays (LCDs), organic light emitted diode (OLED) displays, plasma display panels (PDPs) and field emission displays (FEDs), etc.

SUMMARY

One aspect of the present disclosure is to provide a mask plate which includes:

a plurality of first supporting and shielding strips extending in a first direction and a plurality of second supporting and shielding strips extending in a second direction, and the plurality of second supporting and shielding strips and the plurality of first supporting and shielding strips perpendicularly intersect;

the plurality of first supporting and shielding strips and the plurality of second supporting and shielding strips are provided with at least one objective supporting and shielding strip, and an edge of a predetermined surface of the objective supporting and shielding strip parallel to an extending direction of the objective supporting and shielding strip is provided with a thinned area;

the thinned area extends in the extending direction of the objective supporting and shielding strip, and has a thickness in a direction perpendicular to the predetermined surface smaller than a thickness in a direction perpendicular to the predetermined surface of other areas except the thinned area; and the predetermined surface is a surface of the objective supporting and shielding strip facing a deposition material when a mask evaporation is performed through the mask plate.

BRIEF DESCRIPTION OF THE DRAWINGS

FIG. 5 is a schematic diagram of the shielding of the second supporting and shielding strip or the first supporting and shielding strip during the evaporation.

FIG. 6 is a schematic diagram of the shielding of an objective supporting and shielding strip during the evaporation according to an embodiment of the present disclosure.

FIG. 7 is a schematic diagram showing the second supporting and shielding strip or the first supporting and shielding strip shields pixels.

FIG. 8 is a schematic diagram showing the objective supporting and shielding strip according to embodiments of the present disclosure shields pixels;

FIG. 9 is a schematic diagram showing a structure of the objective supporting and shielding strip of the mask plate according to an embodiment of the present disclosure in different views;

DETAILED DESCRIPTION

Technical solutions of embodiments of the present disclosure will be described below in combination with the accompanying drawings in embodiments of the present disclosure. It is obvious that the described embodiments are only a part of embodiments of the present disclosure, not all embodiments of the present disclosure. All the other embodiments achieved by those of ordinary skills in the art based on the embodiments of the present disclosure without creative work shall fall within the protection scope of the present disclosure.

Unless otherwise defined, technical terms or scientific terms used herein shall be comprehended as the common meaning understood by those of ordinary skills in the art. The terms "first", "second" and the like used in the present disclosure do not denote any sequence, quantity, or importance, but are used to distinguish different components. The words "include", "comprise" or the like mean that the element or object preceding the word encompasses the elements or objects and their equivalents as listed after the word, and does not exclude other elements or objects. "Upper", "lower" and the like are only used to indicate the relative positional relationship, and when the absolute position of the object to be described is changed, the relative positional relationship may also change accordingly.

The inventor notices that the mask plate may have problems of poor edge linearity of a supporting and shielding strip, low shielding accuracy at pixel positions, and a large shadow area of evaporation, and these problems may affect the achievement of a high-precision mask for a display panel having a high pixel density.

Figure 1:
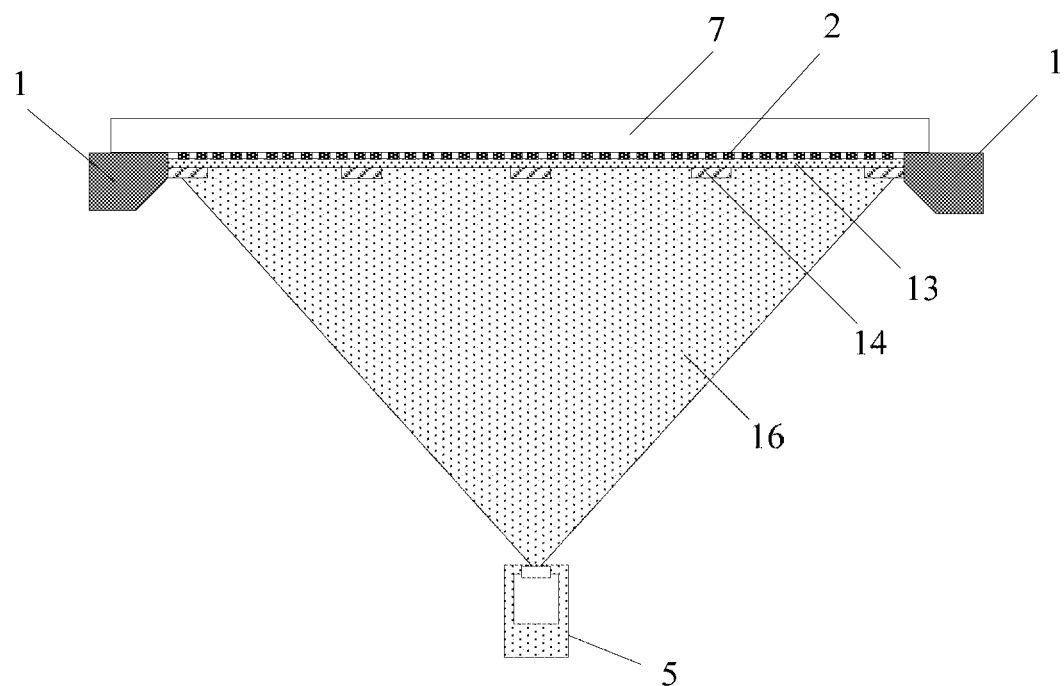
FIG. 1 is a schematic diagram showing that a mask evaporation is performed through a mask plate.
Figure 2:
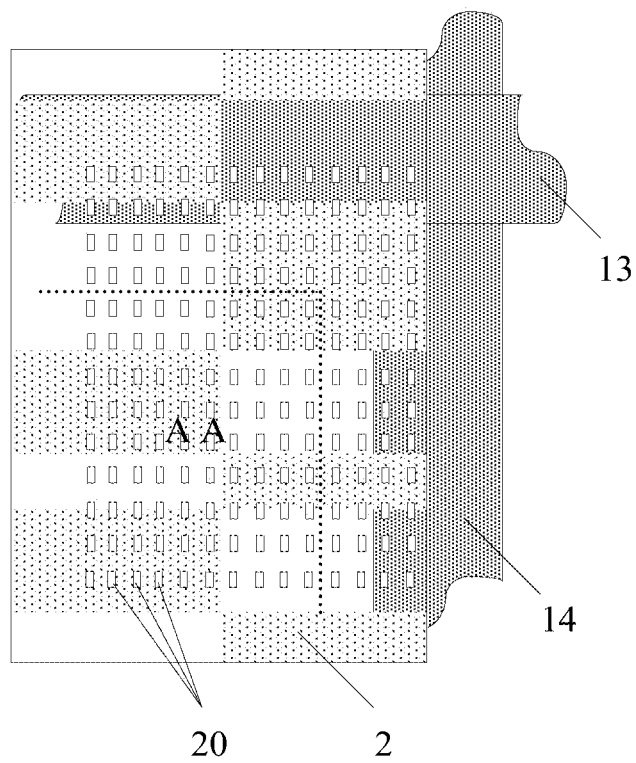
FIG. 2 is a schematic diagram showing that a second supporting and shielding strip or a first supporting and shielding strip of the mask plate shields pixels.

As shown in FIGS. 1 and 2, a fine metal mask (FMM) or an open mask is adopted as an evaporation mask plate in the process of manufacturing the OLED. The light-emitting material 16 of an evaporation source 5 is deposited on the corresponding opening area of the display panel 7, and the mask plate plays an important role in the manufacture of the OLED product. Besides supporting a mask strip 2, the first supporting and shielding strip 13 and the second supporting and shielding strip 14 adopted in manufacturing the FMM and fixed on a mask frame 1 also function to cover the pixels 20 on the mask strip 2, which requires the second supporting and shielding strip 14 and the first supporting and shielding strip 13 to have a higher edge positional accuracy. For OLED products, the process margin from the edge of the pixel covering area to the edge of the display (AA) area is usually 1 to 2 rows of the pixel width. For products having a higher density pixel (PPI) in the future, the process margin of pixel covering width will continue to decrease, which may have a more strict requirement on linearity of the second supporting and shielding strip 14 and the first supporting and shielding strip 13 and may also require the first supporting and shielding strip and the second supporting and shielding strip to have a smaller evaporation shadow covering area, thereby not causing a poor evaporation.

Figure 3:
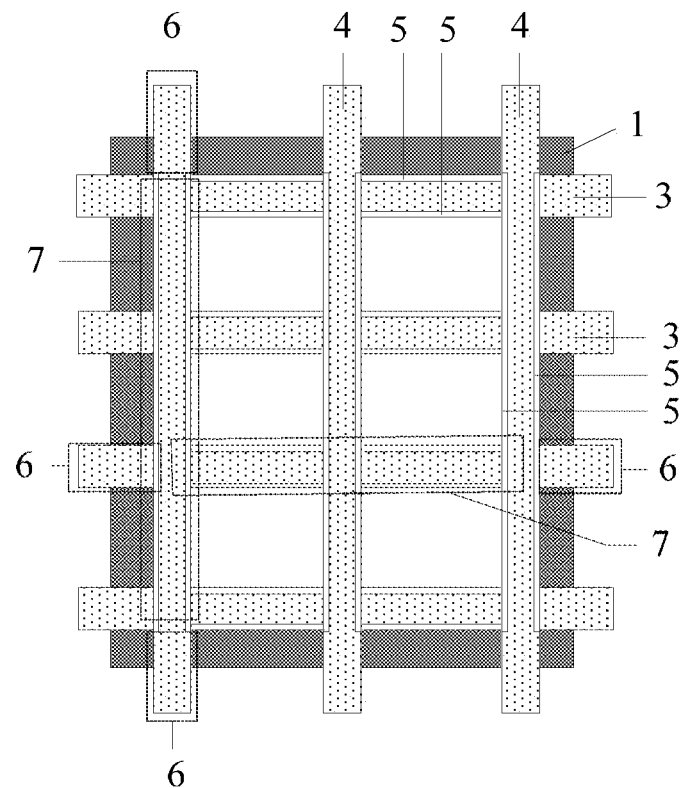
FIG. 3 is a schematic diagram showing a structure of a mask plate according to an embodiment of the present disclosure.

Refer to FIG. 3, a mask plate is provided according to an embodiment of the present disclosure, the mask plate includes a plurality of first supporting and shielding strips 4 extending in a first direction, and a plurality of second supporting and shielding strips 3 extending in a second direction. The first supporting and shielding strips 4 and the second supporting and shielding strips 3 perpendicularly intersect.

The plurality of first supporting and shielding strips 4 and the plurality of second supporting and shielding strips 3 are provided with at least one objective supporting and shielding strip. An edge of a predetermined surface of the objective supporting and shielding strip parallel to the extending direction of the objective supporting and shielding strip is provided with a thinned area (FIG. 3 shows that both the plurality of first supporting and shielding strips 4 and the plurality of second supporting and shielding strips 3 are all the objective supporting and shielding strips but a part of the first supporting and shielding strips 4 or the second supporting and shielding strips 3 may not be the objective supporting and shielding strips, which are not limited in the embodiments of the present disclosure). That is, the objective supporting and shielding strips may be the supporting and shielding strips having a thinned area of the mask plate. When a certain first supporting and shielding strip 4 has a thinned area, the first supporting and shielding strip 4 is the objective supporting and shielding strip. When a certain second supporting and shielding strip 3 has a thinned area, the second supporting and shielding strip 3 is the objective supporting and shielding strip.

For example, as shown in FIG. 3, the thinned area 5 is provided on both sides of the supporting and shielding strips, and extends in the extending direction of the first supporting and shielding strip 4 or the second supporting and shielding strip 3 where the thinned area 5 is located. The thinned area 5 has a thickness smaller than a thickness of other areas except the thinned area 5. For example, the other areas may be opposite areas between the two thinned areas on both sides of the same first supporting and shielding strip 4. The predetermined surface is a surface of at least one of the first supporting and shielding strip 4 and the second supporting and shielding strip 3 facing the deposition material when the mask evaporation is performed through the mask plate.

Figure 4:
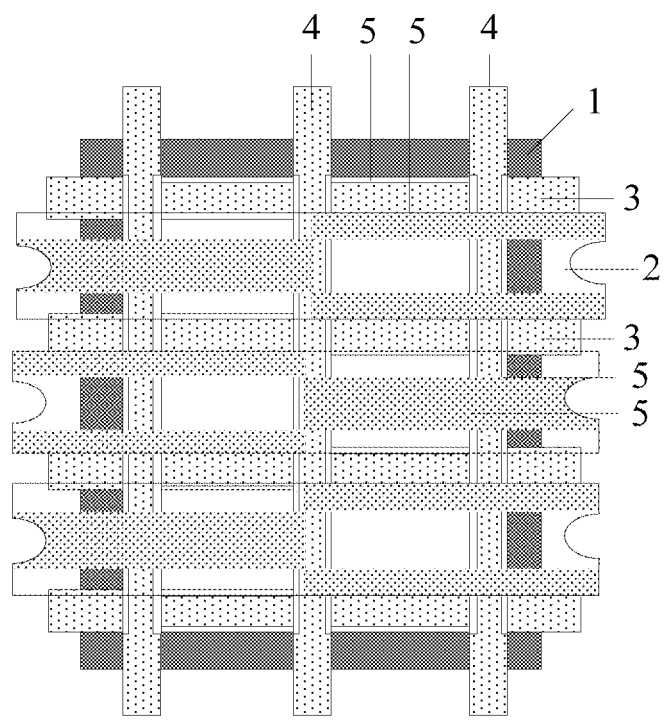
FIG. 4 is a schematic diagram showing a structure of another mask plate according to an embodiment of the present disclosure.

FIG. 3 is an example showing that the first direction is a vertical direction and the second direction is a horizontal direction. In implementation, the first direction may also be the horizontal direction, and the second direction may be the vertical direction, correspondingly. Furthermore, as shown in FIG. 4, the mask plate may further include a mask frame 1 and the mask frame 1 is further provided with a mask strip 2 thereon. The mask strip 2 is provided with a plurality of openings (not shown in FIG. 4) for evaporation. The second supporting and shielding strip 3 may function to cover edge pixels of the mask strip 2 and has a same extending direction as that of the mask strip 2. The first supporting and shielding strip 4 may function to support the mask strip 2 and an extending direction thereof is perpendicular to that of the mask strip 2, and the first supporting and shielding strip 4 may also function to cover some pixels of the mask strip 2. For example, the second supporting and shielding strip 3 and the first supporting and shielding strip 4 are welded to the mask frame 1.

In implementation, as shown in FIG. 3, for each of the first supporting and shielding strips 4 and each of the second supporting and shielding strips 3, two end portions 6 overlapping the mask frame 1 and an intermediate portion 7 located between the two end portions 6 are further provided. In a direction of the first direction, the length of the thinned area of the first supporting and shielding strip 4 is equal to the length of the intermediate portion 7 of the first supporting and shielding strip 4. In a direction of the second direction, the length of the thinned area 5 of the second supporting and shielding strip 3 is equal to the length of the intermediate portion 7 of the second supporting and shielding strip 3. In other words, the thinned area 5 may cover edge pixels of the mask strip 2. For the sake that the second supporting and shielding strip 3 or the first supporting and shielding strip 4 is fixed more stably to the mask frame 1, the thinned area 5 may not be provided on the end portion 6 overlapping the mask frame 1.

The mask plate according to the embodiments of the present disclosure includes a plurality of first supporting and shielding strips 4 extending in a first direction, and a plurality of second supporting and shielding strips 3 extending in a second direction. At least one of each of the first supporting and shielding strips 4 and each of the second supporting and shielding strips 3 is provided with a thinned area 5 on a side of a predetermined surface parallel to the extending direction of the second supporting and shielding strip 3 or the first supporting and shielding strip 4, and the thinned area 5 extends in the extending direction of the first supporting and shielding strip 4 or the second supporting and shielding strip 3 where the thinned area 5 is located on. The thinned area 5 has a thickness smaller than the thickness of other areas except the thinned area 5. Because the thinned area 5 is provided, when the first supporting and shielding strip or the second supporting and shielding strip is manufactured by an etching process, the edge linearity of the objective supporting and shielding strip can be improved. For arrangement of the thinned area 5 of the objective supporting and shielding strip, please refer to FIGS. 5-8. FIG. 5 is a schematic view showing a covering effect of the first supporting and shielding strip 13 or the second supporting and shielding strip during the evaporation process in FIG. 2. FIG. 6 is a schematic view showing a covering effect of the objective supporting and shielding strip t during the evaporation process according to the embodiment of the present disclosure. It can be seen from FIGS. 5 and 6 that the thickness of the objective supporting and shielding strip is generally thin, usually at a micrometer level, and when the objective supporting and shielding strip is provided with a thinned area, the b1 in FIG. 6 will be smaller. In addition, when the width (b2 in FIG. 6, which is namely the width of the thinned area in a direction perpendicular to the extending direction of the second supporting and shielding strip) of the thinned area is set to the millimeter level, the angle a2 in FIG. 6 may be much larger than the angle a1 in the figure. The angle a1 is an evaporation angle occurring when the evaporation is performed through the mask. The presence of the evaporation angle may prevent the area on the display panel requiring to be vapor-deposited from being deposited with any material (an area 17 in FIGS. 5 and 6 is an area that evaporation material can cover). While, the limitation to the evaporation angle during the evaporation process will be reduced if the angle a2 is much larger than the angle a1 in the figure, so that the shadow covering area S2 caused by the thickness of the objective supporting and shielding strip t is smaller than the area S1 when the thickness was not thinned before.

FIG. 7 is a schematic diagram showing pixels are covered by the mask plate as shown in FIG. 2, and FIG. 8 is a schematic diagram showing pixels are covered by the mask plate according to the embodiment of the present disclosure. In the actual masking process, a process margin of at least two columns (or two rows) of pixels is required to remain between the edge of the second supporting and shielding strip 3 or the edge of the first supporting and shielding strip 4 and the display area AA. Furthermore, after the PPI of the display panel is increased, the distance between two columns of the pixels is obviously smaller than the distance between two columns of pixels of the display panel having a low PPI. That is, the process margin d2 as required in design is smaller than the current distance d1. Thus, a mask plate having a higher precision is required. The mask plate provided by the embodiments of the present disclosure has a good edge linearity and an accurate precision control, which can improve the shielding accuracy of the pixel positions, reduce the shadow covering area of the evaporation, and thereby achieve the mask for the display panel having a high pixel density.

Figure 10:
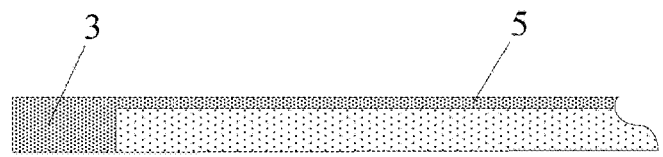
FIG. 10 is a schematic diagram showing a structure of the objective supporting and shielding strip of the mask plate according to the embodiments of the present disclosure in different views.
Figure 11:
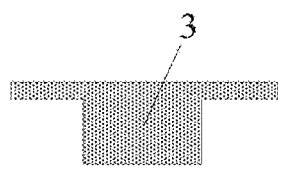
FIG. 11 is a schematic diagram showing a structure of the objective supporting and shielding strip of the mask plate according to the embodiments of the present disclosure in different views.

FIGS. 9-11 provide schematic diagrams showing an enlarged structure of a single objective supporting and shielding strip t. FIG. 9 is a bottom view of the objective supporting and shielding strip t viewed from bottom up in a direction of evaporation in the working state, FIG. 10 is a front view, and FIG. 11 is a cross-sectional view taken along AA'. For example, the thinned area 5 of the objective supporting and shielding strip t has a width of about 0.5 to 5 mm in a direction perpendicular to the extending direction of the objective supporting and shielding strip (that is, the vertical direction in FIG. 9).

For the objective supporting and shielding strip t, it may be overlapped with the mask strip 2 and the mask frame 1 and is provided with a certain supporting strength by the mask strip 2 and the mask frame 1. In the embodiment of the present disclosure, the width of the thinned area of the objective supporting and shielding strip is about 0.5 to 5 mm, and thus the objective supporting and shielding strip can achieve the high-precision mask for the display panel having a high pixel density, and can also maintain a certain supporting strength of the objective supporting and shielding strip, prevent the objective supporting and shielding strip from being sagged because of too much deposition of the evaporation material and thus specific pixels cannot be covered due to too great deviation in edge positional precision of the objective supporting and shielding strip.

For example, the thickness of the thinned area is about one sixth to two thirds of the thickness of the objective supporting and shielding strip where the thinned area is located. In the embodiments of the present disclosure, the thickness of the thinned area is about one sixth to two thirds of the thickness of the objective supporting and shielding strip where the thinned area is located, so that the objective supporting and shielding strip can achieve high-precision mask for the display panel having a high pixel density.

For example, the orthographic projection of the thinned area on the predetermined surface is a rectangle or a trapezoid. For example, the long side of the rectangle or the long side of the trapezoid serves as edges of the objective supporting and shielding strip.

Figure 12:
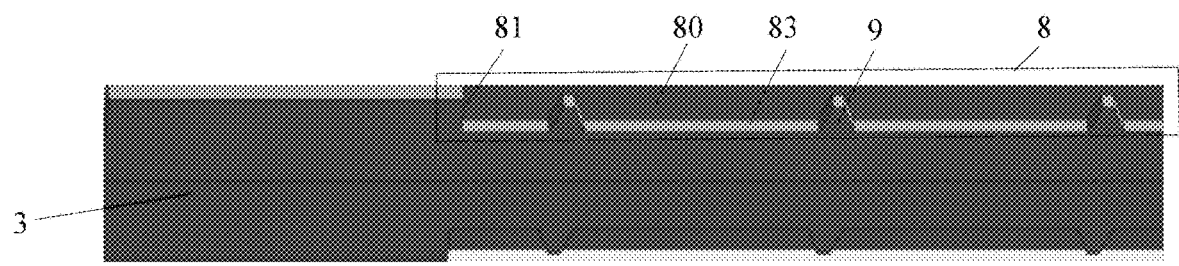
FIG. 12 is a schematic diagram showing a structure of the objective supporting and shielding strip provided with a first rib according to an embodiment of the present disclosure.
Figure 13:
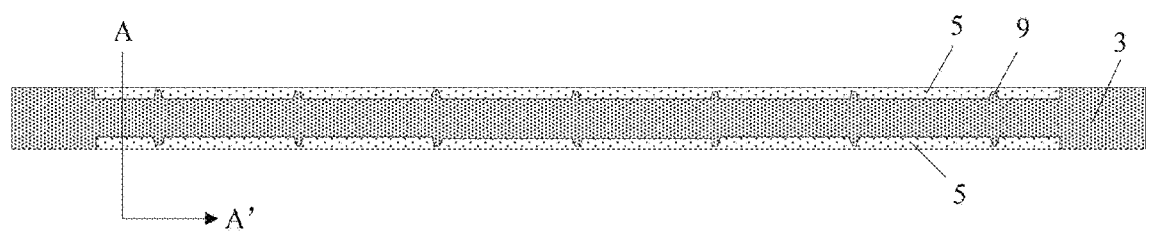
FIG. 13 is a schematic diagram showing a structure of the objective supporting and shielding strip provided with a first rib according to an embodiment of the present disclosure in different views.
Figure 14:
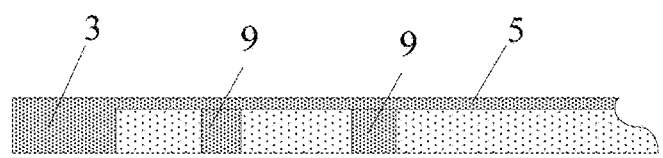
FIG. 14 is a schematic diagram showing a structure of the objective supporting and shielding strip provided with a first rib according to an embodiment of the present disclosure in different views.
Figure 15:
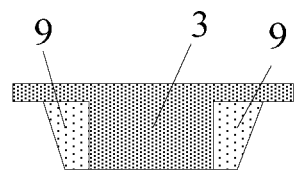
FIG. 15 is a schematic diagram showing a structure of the objective supporting and shielding strip provided with a first rib according to an embodiment of the present disclosure in different views.
Figure 16:
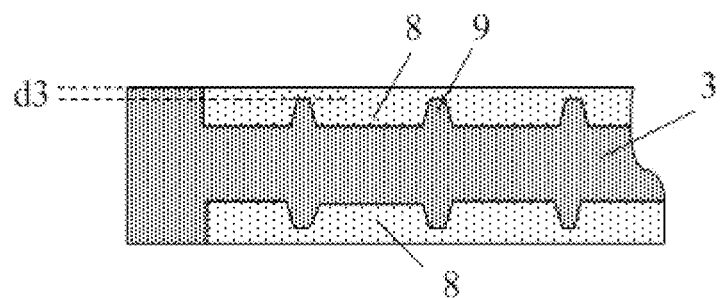
FIG. 16 is a schematic diagram showing a structure of the first rib with different shapes according to the embodiments of the present disclosure.
Figure 17:
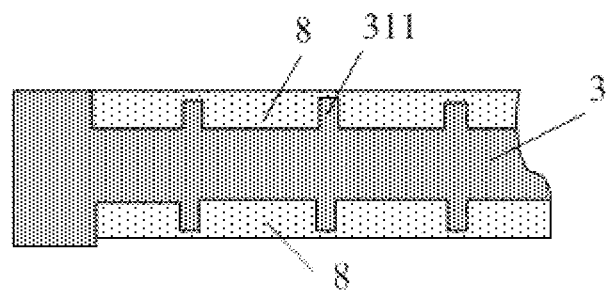
FIG. 17 is a schematic diagram showing a structure of the first rib with different shapes according to the embodiments of the present disclosure.
Figure 18:
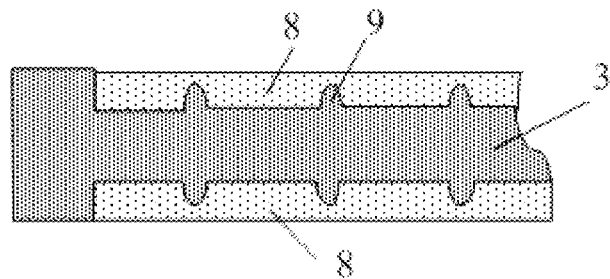
FIG. 18 is a schematic diagram showing a structure of the first rib with different shapes according to the embodiments of the present disclosure.
Figure 19:
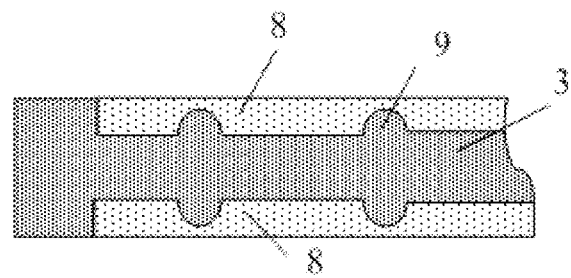
FIG. 19 is a schematic diagram showing a structure of the first rib with different shapes according to the embodiments of the present disclosure.

For the implementation, refer to FIGS. 12 to 15. FIG. 12 is a schematic diagram showing a stereostructure of the thinned area, which has a step structure 8, of the objective supporting and shielding strip t; FIG. 13 is a bottom view of the objective supporting and shielding strip t viewed from bottom up in a direction of evaporation in the working state; FIG. 14 is a front view; and FIG. 15 is a cross-sectional view taken along AA'. The thinned area is of a recessed strip-like step structure 8. The step structure 8 includes a bottom surface 80, a first side surface 81 and a second side surface (not shown) that are opposite to each other and both perpendicularly connected to the bottom surface 80, and an objective side surface 83 connecting the first side surface 81 and the second side surface. The first side surface 81 is opposite to the second side surface and perpendicular to the extending direction of the first supporting and shielding strip 4 or the second supporting and shielding strip 3 where the thinned area 5 is located. The thinned area 5 is further provided with a plurality of first ribs 9 that are spaced apart from each other. Each first rib 9 has a bottom end fixed to the objective side surface 83 of the step structure 8 and extends in a direction perpendicular to the objective side surface 83. In addition, a side surface of the first rib 9 is partially overlapped with the bottom surface 80 of the step structure 8. That is, the first rib 9 is fixedly connected with both the objective side surface 83 and the bottom surface 80. In addition, the plurality of the first ribs 9 may be evenly distributed in the extending direction of the objective supporting and shielding strip tin the thinned area 5, which can further increase the firmness of the thinned area 5.

In the embodiments of the present disclosure, the thinned area 5 is further provided with a plurality of first ribs 9 that are spaced apart from each other. Each first rib 9 has a bottom end fixed to the objective side surface 83 of the step structure 8 and extends in a direction perpendicular to the objective side surface 83. In addition, a side surface of the first rib 9 is partially overlapped with the bottom surface 80 of the step structure 8. Thus, the strength of the thinned area 5 at the edge of the second supporting and shielding strip 3 or the first supporting and shielding strip 4 can be increased by designing the first rib 9, thereby preventing edges of thinned area 5 of the second supporting and shielding strip 3 or the first supporting and shielding strip 4 from being sagged because of too much deposition of the evaporation material, and thus the specific pixel cannot be covered due to too great deviation in edge positional precision of the second supporting and shielding strip 3 or the first supporting and shielding strip 4.

For example, as shown in FIGS. 16-19, the orthographic projection of the first rib 9 on the bottom surface 80 of the step structure is generally trapezoidal, square, semi-elliptical or semi-circular. In implementation, the length of the first rib 9 in a direction perpendicular to the objective side surface is less than or equal to the length of the step structure in a direction perpendicular to the objective side surface. That is, an orthographic projection of the first rib 9 on a plane of the bottom surface 80 is in the bottom surface 80. For example, the distance d3 between the top end of the first rib 9 opposite to the objective side surface and the side surface of the step structure opposite to the third side surface is 0.1 to 3 mm. That is, an end of the orthographic projection of the first rib 9 on a plane of the bottom surface 80, which is away from the objective side surface, is 0.1~3 mm from a side (an upper side or a lower side of the bottom surface 80 in FIGS. 16-19) of the bottom surface 80 which is away from the objective side surface. In embodiments of the present disclosure, the length of the first rib 9 in a direction perpendicular to the objective side surface is less than or equal to the length of the step structure in a direction perpendicular to the objective side surface, so that the position provided with the first rib 9 may also have a better edge linearity, without affecting the covering effect of the objective supporting and shielding strip on the display panel having a high pixel density.

In implementation, the first rib 9 has a width of about 1 to 6 mm in the extending direction of the objective supporting and shielding strip where the first rib 9 is located. For the first rib 9 that is substantially trapezoidal or semi-circular, the width may refer to the distance between two points with the maximum distance in the extending direction of the first supporting and shielding strip 4 or second supporting and shielding strip 3, such as, the diameter of the circle in FIGS. 16-19.

In implementation, the display panel may be further provided with a specially shaped OLED screen, such as a full screen with a U-shaped groove at the top. That is, the display panel is gradually moving towards full-screen designs with a U-shaped groove provided at the upper or lower end of the full screen. For example, the U-shaped groove may be configured to provide an infrared lens, a floodlight sensing element, a distance sensor, an ambient light sensor, a speaker, a microphone, a camera, a dot matrix projector, and the like. For example, as shown in FIGS. 20-25, the first supporting and shielding strip 4 or the second supporting and shielding strip 3 (that is the objective supporting and shielding strip) is further provided with a U-shaped protrusion 10 at a predetermined position of a side parallel to the extending direction of the first supporting and shielding strip 4 or second supporting and shielding strip 3, the U-shaped protrusion being configured to cover a U-shaped groove of the display panel having the U-shaped groove. Due to the design of the U-shaped groove of the display panel, the mask plate is generally required to have a higher precision mask for the area of the U-shaped groove. In the embodiments of the present disclosure, the first supporting and shielding strip 4 or the second supporting and shielding strip 3 is further provided with a U-shaped protrusion 10 at a predetermined position of a side parallel to the extending direction of the first supporting and shielding strip 4 or second supporting and shielding strip 3, which can achieve the high-precision mask for the U-shaped groove of this type of the display panel.

Figure 20:
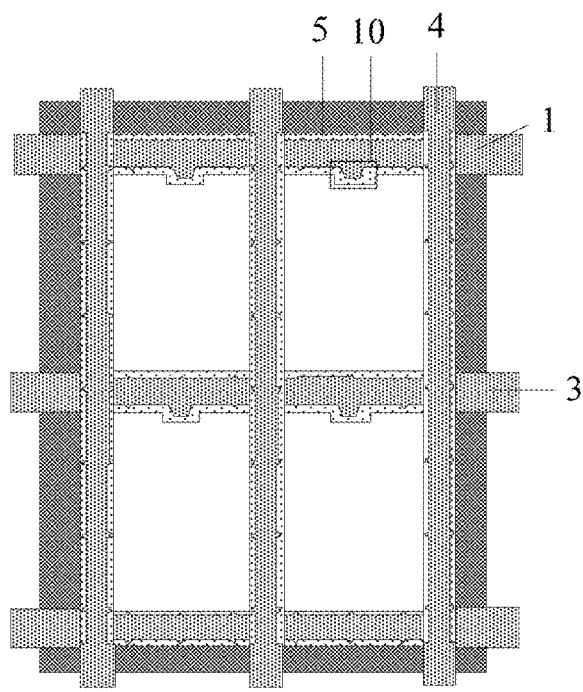
FIG. 20 is a schematic diagram showing a structure of a mask plate provided with a protrusion according to an embodiment of the present disclosure.
Figure 21:
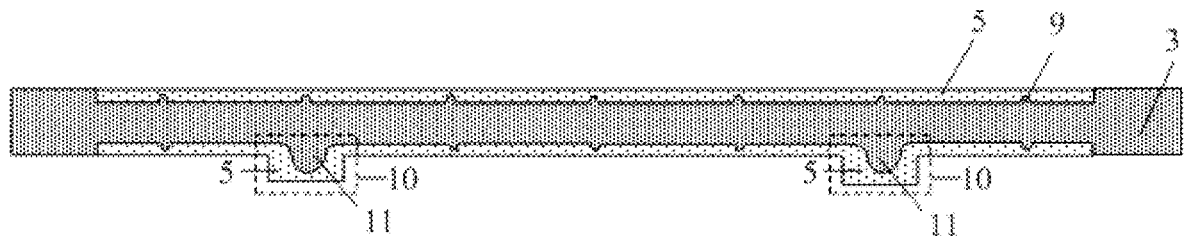
FIG. 21 is a schematic diagram showing a structure of the objective supporting and shielding strip provided with a protrusion according to the embodiments of the present disclosure.
Figure 22:
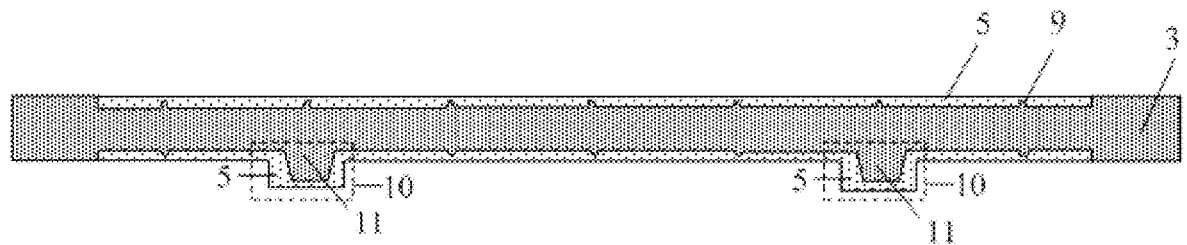
FIG. 22 is a schematic diagram showing a structure of the objective supporting and shielding strip provided with a protrusion according to the embodiments of the present disclosure.
Figure 23:
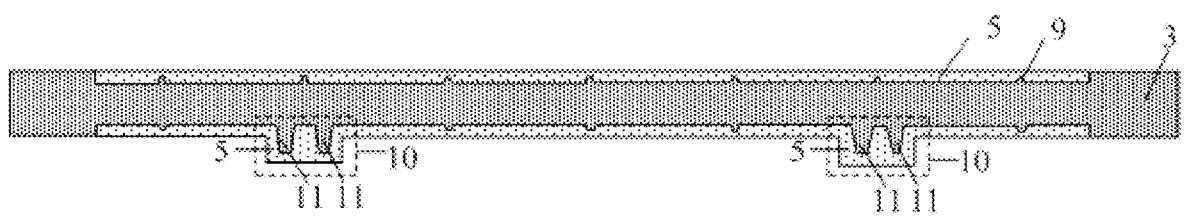
FIG. 23 is a schematic diagram showing a structure of the objective supporting and shielding strip provided with a protrusion according to the embodiments of the present disclosure.
Figure 24:
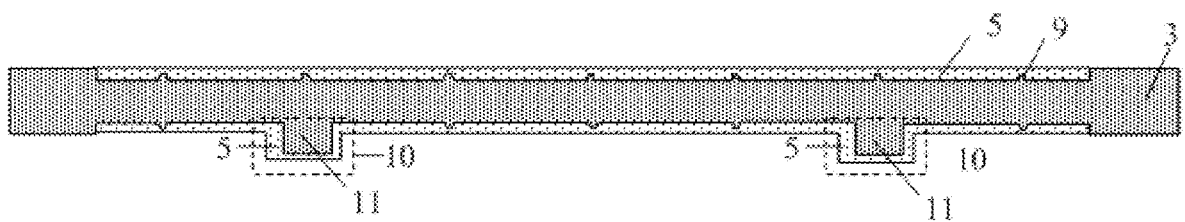
FIG. 24 is a schematic diagram showing a structure of the objective supporting and shielding strip provided with a protrusion according to the embodiments of the present disclosure.
Figure 25:
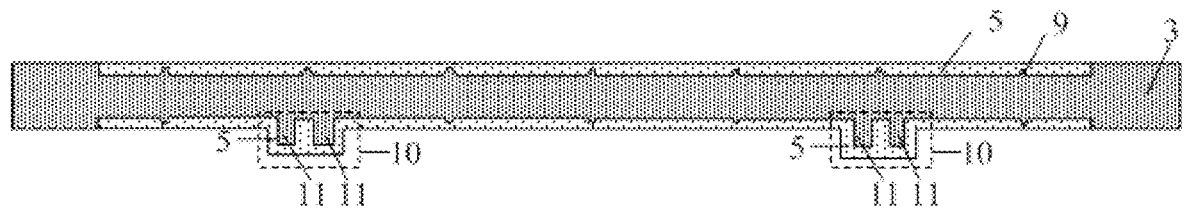
FIG. 25 is a schematic diagram showing a structure of the objective supporting and shielding strip provided with a protrusion according to the embodiments of the present disclosure.

It should be noted that FIG. 20 is an example showing that a mask plate can manufacture four display panels having U-shaped grooves. In other words, each display panel is provided with a U-shaped groove. Correspondingly, the first supporting and shielding strip 4 is provided with two U-shaped protrusions 10. In implementation, one mask plate may manufacture a plurality of display panels having the U-shaped groove, and the second supporting and shielding strip or the first supporting and shielding strip may also be provided with a plurality of U-shaped protrusions 10. However, embodiments of the present disclosure are not limited thereto.

For example, as shown in FIGS. 21-25, the U-shaped protrusion 10 also has a thinned area 5 at a periphery of a surface facing the deposition material. For example, the thinned area 5 may be provided with the same width and thickness as those of the thinned area at other positions of the second supporting and shielding strip or first supporting and shielding strip, which will not be described herein again.

For example, each of the U-shaped protrusions 10 may include one or more second ribs 11 that are spaced apart from each other. An end of each of the second ribs 11 is fixed to the second supporting and shielding strip 3 (or the first supporting and shielding strip) and extends in a direction perpendicular to the extending direction of the second supporting and shielding strip 3 (or the first supporting and shielding strip) where the U-shaped protrusion 10 is located. That is, each of the second rib is both fixedly connected with the objective side surface and the bottom surface of the step structure. When the U-shaped protrusion 10 is provided with the plurality of second ribs 11, the thinned area 5 is also provided between adjacent second ribs 11, that is, the U-shaped protrusion may be located in the thinned area 5. The second rib 11 may serve to increase the supporting strength of the U-shaped protrusion 10. Since the U-shaped grooves of the display panel may have different lengths, the U-shaped protrusion 10 on the corresponding mask plate may also have different extending lengths in the direction parallel to the objective supporting and shielding strip t. If the extending length of the U-shaped protrusion 10 in the direction parallel to the objective supporting and shielding strip t is short, the U-shaped protrusion 10 may be further provided with a second rib 11 for enhancing the supporting function. That is, the U-shaped protrusion 10 includes a second rib 11 and a thinned area 5 provided at the periphery of the second rib 11. If the extending length of the U-shaped protrusion 10 in the direction parallel to the second supporting and shielding strip 3 (or the first supporting and shielding strip) is long, the U-shaped protrusion 10 may be provided with a plurality of second ribs 11 independent from each other, in order to better improve the supporting strength of the U-shaped protruding portion 10. In this case, the U-shaped protrusion 10 includes a plurality of second ribs 11 spaced apart from each other, a thinned area 5 located between adjacent two ribs 11, and a thinned area outside each of the second ribs 11. However, no matter how many second ribs are included in the U-shaped protrusion 10, the U-shaped protrusion 10 per se may be an integral structure that is connected integrally. That is, it may form a U-shaped groove corresponding to the display panel under the covering function of the U-shaped protrusion 10.

For example, the orthographic projection of the second rib 11 on the first predetermined surface is square, semi-circular, semi-elliptical or inverted trapezoidal.

For example, the U-shaped protrusion 10 has a length of about 1 to 5 cm in the direction perpendicular to the extending direction of the objective supporting and shielding strip t where the U-shaped protrusion 10 is located.

The mask plate according to the embodiments of the present disclosure includes a plurality of first supporting and shielding strips extending in a first direction, and a plurality of second supporting and shielding strips extending in a second direction. At least one of each of the first supporting and shielding strips and each of the second supporting and shielding strips is provided with a thinned area on a side of a predetermined surface parallel to the extending direction of the first supporting and shielding strip or second supporting and shielding strip. The thinned area extends in the extending direction of the second supporting and shielding strip or first supporting and shielding strip where the thinned area is located, and has a thickness smaller than the thickness of other areas except the thinned area. Because the thinned area is provided, when the first supporting and shielding strip or the second supporting and shielding strip is manufactured by an etching process, the edge linearity of the second supporting and shielding strip or the first supporting and shielding strip can be improved. The improved edge linearity of the second supporting and shielding strip or first supporting and shielding strip may achieve the covering of a display panel having a high pixel density. In addition, the limitation to the evaporation angle may also be reduced by providing the second supporting and shielding strip or the first supporting and shielding strip with the thinned area, so that the shadow covering area caused by the thickness of the first supporting and shielding strip or the second supporting and shielding strip is smaller than the area when the thickness was not thinned before, which enhances the shielding accuracy at the pixel positions, reduces the shadow covering area of the evaporation, and thereby realizing the mask for the display panel having a high pixel density.

The above descriptions are merely specific embodiments of the present disclosure, but the protection scope of the present disclosure is not limited thereto. Variations or substitutions easily envisaged by those of ordinary skills in the art within the technical scope of embodiments of the present disclosure shall all fall within the protection scope of the present disclosure.

A method for manufacturing a display panel is further provided by the present disclosure. The method includes:

providing a base substrate; and forming a plurality of structures for realizing a display function on the base substrate by a patterning process; wherein a mask plate used in the patterning process includes any one of the mask plates provided by the above embodiments.

A display panel is further provided by the present disclosure. The display panel includes a base substrate and a plurality of structures formed by a patterning process and used to realize a display function, and the plurality of structures is used to realize a display function being located on the base substrate; wherein, a mask plate used in the patterning process includes any one of the mask plates provided by the above embodiments.

In the drawings of the present application, the dimensions of layers and regions may be exaggerated for clarity of illustration. It will also be understood that when an element or layer is referred to as being "on" another element or layer, it can be directly on the other element or intervening layers may be present. In addition, it will be understood that when an element or layer is referred to as being "under" another element or layer, it can be directly under the other element or more than one intervening layer or element may be present. In addition, it is also understood that when a layer or element is referred to as being "between" two layers or two elements, it can be the only layer between the two layers or two elements, or one or more intervening layers may also be present. Or components. Similar reference numerals indicate similar elements throughout.

A mask plate provided by the embodiments of the present disclosure include:

a plurality of first supporting and shielding strips extending in a first direction and a plurality of second supporting and shielding strips extending in a second direction, and the plurality of second supporting and shielding strips and the plurality of first supporting and shielding strips perpendicularly intersect;

the plurality of first supporting and shielding strips and the plurality of second supporting and shielding strips are provided with at least one objective supporting and shielding strip, and an edge of a predetermined surface of the objective supporting and shielding strip parallel to an extending direction of the objective supporting and shielding strip is provided with a thinned area;

the thinned area extends in the extending direction of the objective supporting and shielding strip, and has a thickness smaller than a thickness of other areas except the thinned area; and the predetermined surface is a surface of the objective supporting and shielding strip facing a deposition material when a mask evaporation is performed through the mask plate.

For example, the mask plate further includes a mask frame, and both each second supporting and shielding strip and each first supporting and shielding strip include two end portions overlapping the mask frame and an intermediate portion located between the two end portions; and in a direction of the first direction, a length of the thinned area of the first supporting and shielding strip is equal to a length of the intermediate portion of the first supporting and shielding strip; and in a direction of the second direction, a length of the thinned area of the second supporting and shielding strip is equal to a length of the intermediate portion of the second supporting and shielding strip.

For example, the thinned area of the first supporting and shielding strip has a width of about 0.5 to 5 mm in a direction perpendicular to the first direction; and the thinned area of the second supporting and shielding strip has a width of about 0.5 to 5 mm in a direction perpendicular to the second direction.

For example, a thickness of the thinned area is about one sixth to two thirds of a thickness of the first supporting and shielding strip or the second supporting and shielding strip where the thinned area is located.

For example, an orthographic projection of the thinned area on the first predetermined surface is a rectangle or a trapezoid.

For example, the thinned area is of a recessed strip-like step structure;

the step structure includes a bottom surface, a first side surface and a second side surface that are opposite to each other and both perpendicularly connected to the bottom surface and a third side surface connecting the first side surface and the second side surface, and the first side surface is opposite to the second side surface and perpendicular to the extending direction of the first supporting and shielding strip or second supporting and shielding strip where the thinned area is located; and the thinned area is further provided with a plurality of first ribs that are spaced apart from each other, a bottom end of each of the first ribs is fixed to the third side surface of the step structure and extends in a direction perpendicular to the third side surface, and a side surface of the first rib is partially overlapped with the bottom surface of the step structure.

For example, the length of the first rib in a direction perpendicular to the third side surface is less than or equal to the length of the step structure in a direction perpendicular to the third side surface.

For example, the distance between the top end of the first rib opposite to the third side surface and the side surface of the step structure opposite to the third side surface is 0.1 to 3 mm.

For example, the orthographic projection of the first rib on the bottom surface of the step structure is trapezoidal, square, semi-elliptical or semi-circular.

For example, the first rib has a width of about 1 to 6 mm in the extending direction of the first supporting and shielding strip or second supporting and shielding strip where the first rib is located.

For example, the second supporting and shielding strip or the first supporting and shielding strip is further provided with a U-shaped protrusion at a predetermined position of a side parallel to the extending direction of the second supporting and shielding strip or first supporting and shielding strip for covering a U-shaped groove of the display panel having the U-shaped groove.

For example, the U-shaped protrusion also has a thinned area at a periphery of a surface facing the deposition material.

For example, the U-shaped protrusions includes one or more second ribs that are spaced apart from each other, an end of each of the second ribs is fixed to the second supporting and shielding strip or the first supporting and shielding strip, and extends in a direction perpendicular to the extending direction of the second supporting and shielding strip or the first supporting and shielding strip where the U-shaped protrusion is located; and when the U-shaped protrusion is provided with the plurality of second ribs, the thinned area is also provided between adjacent second ribs.

For example, the orthographic projection of the second rib on the first predetermined surface is square, semi-circular, semi-elliptical or inverted trapezoidal.

For example, the U-shaped protrusion has a length of about 1 to 5 cm in the direction perpendicular to the extending direction of the second supporting and shielding strip or the first supporting and shielding strip where the U-shaped protrusion is located.

What is claimed is:

1. A mask plate, comprising: a plurality of first supporting and shielding strips extending in a first direction and a plurality of second supporting and shielding strips extending in a second direction; wherein, the plurality of second supporting and shielding strips and the plurality of first supporting and shielding strips perpendicularly intersect;

the plurality of first supporting and shielding strips and the plurality of second supporting and shielding strips are provided with at least one objective supporting and shielding strip, and an edge of a predetermined surface of the objective supporting and shielding strip parallel to an extending direction of the objective supporting and shielding strip is provided with a thinned area;

the thinned area extends in the extending direction of the objective supporting and shielding strip, and has a thickness in a direction perpendicular to the predetermined surface smaller than a thickness in a direction perpendicular to the predetermined surface of other areas except the thinned area;

the predetermined surface is a surface of the objective supporting and shielding strip facing a deposition material in case a mask evaporation is performed through the mask plate; and the thinned area is provided with a recessed step structure and a plurality of first ribs, the step structure comprises a bottom surface and an objective side surface connected with the bottom surface, the objective side surface is connected with other areas on the predetermined surface except the thinned area, and each of the first ribs is fixedly connected with both the objective side surface and the bottom surface of the step structure.

2. The mask plate according to claim 1, wherein an orthographic projection of the first rib on the plane of the bottom surface of the step structure may be any one of trapezoidal, square, semi-circular and semi-elliptical.

3. The mask plate according to claim 1, wherein the thinned area comprises a first side surface and a second side surface which are oppositely arranged, both the first side surface and the second side surface are vertically connected with bottom surface, and both the first side surface and the second side surface are perpendicular to the extending direction of the objective supporting and shielding strip where the thinned area is located.

4. The mask plate according to claim 1, wherein the first rib has a width of about 1 to 6 mm in the extending direction of the objective supporting and shielding strip.

5. The mask plate according to claim 1, wherein an orthographic projection of the first rib on a plane of the bottom surface is in the bottom surface.

6. The mask plate according to claim 1, wherein the plurality of the first ribs are evenly distributed in the extending direction of the objective supporting and shielding strip in the thinned area.

7. The mask plate according to claim 1, wherein an end of the orthographic projection of the first rib on a plane of the bottom surface, which is away from the objective side surface, is 0.1~3 mm from a side of the bottom surface which is away from the objective side surface.

8. The mask plate according to claim 1, wherein the objective supporting and shielding strip is provided with a U-shaped protrusion at a predetermined position of a side parallel to the extending direction of the objective supporting and shielding strip, and the U-shaped protrusion is configured to cover a U-shaped groove of a display panel having the U-shaped groove.

9. The mask plate according to claim 8, wherein the U-shaped protrusion comprises at least one second rib, each of the second ribs is fixedly connected with both the objective side surface and the bottom surface of the step structure.

10. The mask plate according to claim 8, wherein an orthographic projection of the second rib on the predetermined surface may be any one of square, semi-circular, semi-elliptical and inverted trapezoidal.

11. The mask plate according to claim 8, wherein the U-shaped protrusion has a length of about 1 to 5 cm in a direction perpendicular to the extending direction of the objective supporting and shielding strip where the U-shaped protrusion is located.

12. The mask plate according to claim 8, wherein the U-shaped protrusion is in the thinned area.

13. The mask plate according to claim 1, wherein the mask plate comprises a mask frame, and both each of the second supporting and shielding strips and each of the first supporting and shielding strips comprise two end portions overlapping the mask frame and an intermediate portion located between the two end portions; and in a direction of the first direction, a length of the thinned area of the first supporting and shielding strip is equal to a length of the intermediate portion of the first supporting and shielding strip; and in a direction of the second direction, a length of the thinned area of the second supporting and shielding strip is equal to a length of the intermediate portion of the second supporting and shielding strip.

14. The mask plate according to claim 1, wherein the thinned area of the objective supporting and shielding strip has a width of about 0.5 to 5 mm in a direction perpendicular to the extending direction of the objective supporting and shielding strip.

15. The mask plate according to claim 1, wherein a thickness of the thinned area is about one sixth to two thirds of a thickness of the objective supporting and shielding strip where the thinned area is located.

16. The mask plate according to claim 1, wherein an orthographic projection of the thinned area on the predetermined surface is a rectangle or a trapezoid.

17. The mask plate according to claim 1, wherein, the thinned area is provided with a recessed step structure and a plurality of first ribs, the step structure comprises a bottom surface and an objective side surface connected with the bottom surface, the objective side surface is connected with other areas on the predetermined surface except the thinned area, and each of the first ribs is fixedly connected with both the objective side surface and the bottom surface of the step structure;

an orthographic projection of the first rib on a plane of the bottom surface is in the bottom surface;

the plurality of the first ribs are evenly distributed in the extending direction of the objective supporting and shielding strip in the thinned area;

an orthographic projection of the first rib on the plane of the bottom surface of the step structure may be any one of trapezoidal, square, semi-circular and semi-elliptical;

the objective supporting and shielding strip is provided with a U-shaped protrusion at a predetermined position of a side parallel to the extending direction of the objective supporting and shielding strip, and the U-shaped protrusion is configured to cover a U-shaped groove of a display panel having the U-shaped groove;

the U-shaped protrusion is in the thinned area;

the U-shaped protrusion comprises at least one second rib, each of the second ribs is fixedly connected with both the objective side surface and the bottom surface of the step structure;

an orthographic projection of the second rib on the predetermined surface may be any one of square, semi-circular, semi-elliptical and inverted trapezoidal; and a thickness of the thinned area is about one sixth to two thirds of a thickness of the objective supporting and shielding strip where the thinned area is located.

* * * * *